(12) United States Patent
Bott et al.

(10) Patent No.: US 7,248,620 B2
(45) Date of Patent: Jul. 24, 2007

(54) SYSTEM FOR TREATMENT DATA BY THE FREQUENCY HOPPING METHOD

(75) Inventors: Rainer Bott, Andechs (DE); Dimitri Korobkov, Frankfurt (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 772 days.

(21) Appl. No.: 10/297,067

(22) PCT Filed: Jun. 1, 2001
(Under 37 CFR 1.47)

(86) PCT No.: PCT/EP01/06276

§ 371 (c)(1),
(2), (4) Date: Apr. 22, 2003

(87) PCT Pub. No.: WO01/97401

PCT Pub. Date: Dec. 20, 2001

(65) Prior Publication Data

US 2004/0028120 A1    Feb. 12, 2004

(30) Foreign Application Priority Data

Jun. 14, 2000  (DE) ................ 100 29 308
Mar. 26, 2001  (DE) ................ 101 14 834

(51) Int. Cl.
*H04B 1/713*    (2006.01)
(52) U.S. Cl. .................................... 375/135
(58) Field of Classification Search ........ 375/132–135; 714/776, 786, 790, 794
See application file for complete search history.

(56) References Cited

U.S. PATENT DOCUMENTS

| | | | |
|---|---|---|---|
| 5,259,030 A * | 11/1993 | Francis ................ | 375/346 |
| 5,519,718 A | 5/1996 | Yokev et al. | |
| 5,912,932 A * | 6/1999 | Calderbank et al. ........ | 375/346 |
| 6,581,179 B1 * | 6/2003 | Hassan ................ | 714/776 |
| 2002/0167962 A1 * | 11/2002 | Kowalski ................ | 370/445 |

FOREIGN PATENT DOCUMENTS

DE          690 27 018 T2     8/1991

OTHER PUBLICATIONS

Zyablov, V., et al., "On the Error Exponent for Woven Convolutional Codes with Outer Warp," *IEEE Transactions on Information Theory*, Jul. 1999, vol. 45, No. 5, pp. 1649-1653.
"Our Woven Convolutional Codes" [online], Sep. 24, 1999, pp. 83-130.

* cited by examiner

*Primary Examiner*—Don N. Vo
(74) *Attorney, Agent, or Firm*—Christensen O'Connor Johnson Kindness PLLC

(57) ABSTRACT

The invention relates to a system for transmitting data according to the frequency hopping method. The digital data, which is transmitted in suddenly changing transmission frequency hops, is encoded according to a woven code consisting of an interlinked external and internal convolution code. The data to be transmitted by hop is preferably distributed over several parallel hops sent with different frequencies.

119 Claims, 9 Drawing Sheets

Before the encoding

After the outer encoding

After the inner encoding

SYSTEM FOR TREATMENT DATA BY THE FREQUENCY HOPPING METHOD

CROSS-REFERENCE TO RELATED APPLICATION

This application is a national stage application of prior International Application No. PCT/EP01/06276, filed Jun. 1, 2001, which claims the benefit of German application No. 100 29 308.5, filed Jun. 14, 2000, and German application No. 101 14 834.8, filed Mar. 26, 2001, which are incorporated herein by reference.

FIELD OF THE INVENTION

The invention relates to a system as specified in the preamble of the main claim.

In the transmission of digital data by the frequency hopping method, in which the data are transmitted in abruptly changing transmission frequency segments (hops), the signals are generally impaired by noise or other effects, such as fading, Doppler shift and the like. A fading drop or interference result under these circumstances in the suppression of single or even a plurality of frequency segments so that the entire information (user data and FEC redundancy) is lost. For such frequency hopping methods, it is already also known to encode the data symbols in the individual transmission frequency segments according to a so-called concatenated code comprising an outer and inner code.

These concatenated codes have the disadvantage that an error burst (but no independent error) is produced after incorrect decoding of the inner code. As a consequence, the decoder of the outer concatenated code generates a plurality of errors since the outer code has, as a rule, poor correction characteristics in regard to such error bursts.

The object of the invention is therefore to disclose a system for transmitting data by the frequency hopping method in which these disadvantages are avoided as well as possible and that guarantees as safe a data transmission as possible by the transmission channel even in the event of severe distortions.

SUMMARY OF THE INVENTION

Proceeding from a system as specified in the preamble of the main claim, this object is achieved by its characterizing features. Advantageous developments emerge from the subclaims.

The use of so-called woven codes, such as those described in detail, for example, in Host, S. Johannesson, R. and Zyablov, V.: "A first encounter with binary woven convolutional codes", in Proc. International Symposium on Communication Theory and Application, Lake District, UK, July 1997 or Host, S. on Woven Convolutional Codes, Ph.D. Thesis, Lund University, 1999, ISBN 91-7167-016-5, http://www.it.lth.se/stefanh/thesis/, guarantees, even with severe distortions due to the channel, such as fading drops, that the lost information can be recovered in the disturbed frequency segments by the encoding used. In woven codes, the decoding errors mentioned due to error bursts are very largely avoided since the error bursts generated by the decoder are distributed independently of one another between the different inner and outer codes, respectively, which results finally in independent errors in the respective other code (outer or inner code, respectively) as is explained in greater detail below by reference to examples. It has proved particularly advantageous to terminate the encoding within a transmission frequency segment in the respective frequency segment, i.e. the encoding begins with the start of the frequency segment and ends with it. This avoids the possibility that any erased frequency segment falsifies the information at the beginning or at the end of the preceding or subsequent frequency segment, respectively, the encoding in a frequency segment therefore functioning independently of the other frequency segments. The system according to the invention can be applied to all possible transmission channels, for example in the case of a so-called AWGN channel (transmission channel with additive white Gaussian noise) or even in the case of Rayleigh channels. The use of binary convolutional codes makes it possible to use, for the decoding of the outer code, so-called soft decodings or so-called iterative decodings such as are described, for example, in Johannesson R., Zigangirov, K . . . "Fundamentals of Convolutional Coding", IEEE Press, 1999, ISBN 0-7803-3483-3.

In the system specified in the main claim, the entire data of a frequency segment (hop) are transmitted over a frequency segment that is continuous in terms of frequency and, therefore, disturbances, such as fading drops with flat fading or emissions by other transmitters (collisions in the case of CSMA) can erase the entire frequency segment.

The latter disadvantages can be eliminated at least partly by the development according to claims 30 and thereafter.

BRIEF DESCRIPTION OF THE DRAWINGS

A better understanding of the present invention can be derived by reference to the appended drawings in conjunction with the description that ensues.

The invention is explained in greater detail below by reference to exemplary embodiments on the basis of diagrammatic drawings.

DETAILED DESCRIPTION OF THE INVENTION

Figure 1:
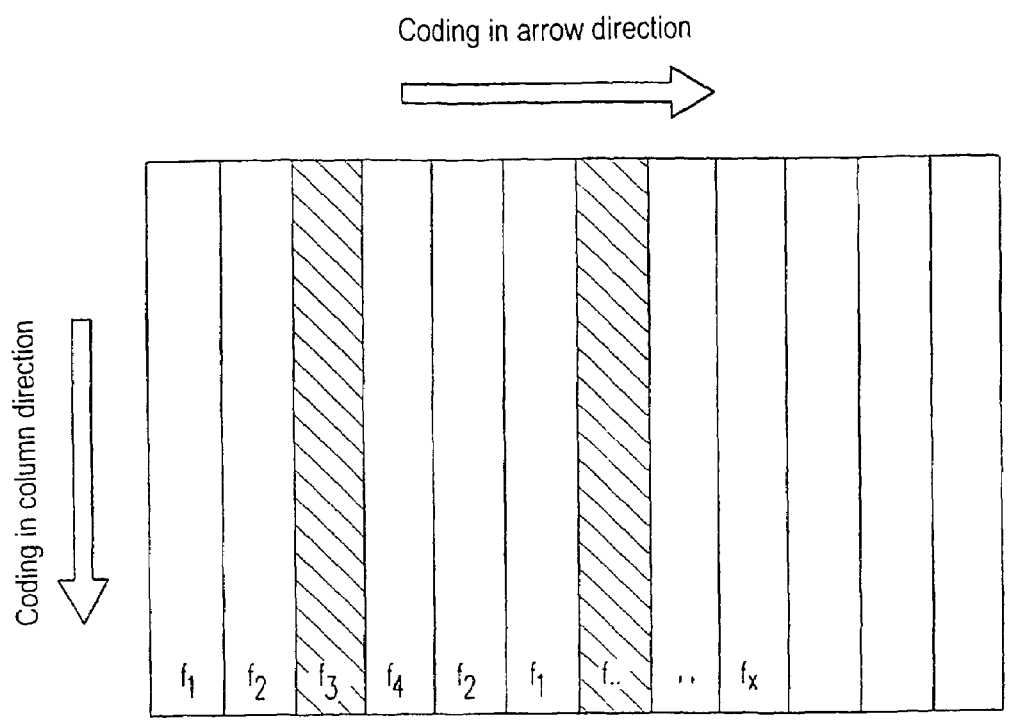
FIG. 1 shows a diagram of the transmission of digital data by a frequency hopping method.

FIG. 1 shows diagrammatically the transmission of digital data by the frequency hopping method. In this method, the data are transmitted in abruptly changing, temporally consecutive transmission frequency segments $f1$ to $f_x$, which may repeat in any desired sequence, from the transmitter to the receiver. As a result of fading drops or other distortions, some or a plurality of said frequency segments may be suppressed, as is shown for some segments by hatching in FIG. 1. The data to be transmitted are encoded according to an outer convolutional code and an inner convolutional code concatenated therewith according to a known woven code, such as is described in greater detail in the literature by Host described at the outset. The data symbols that are transmitted in a frequency segment may be interpreted mathematically as a column of a matrix, with the result that the transmission can be interpreted as a whole as encoding in the direction of the matrix columns and encoding in the direction of the matrix rows of a semi-infinite matrix.

Figure 2:
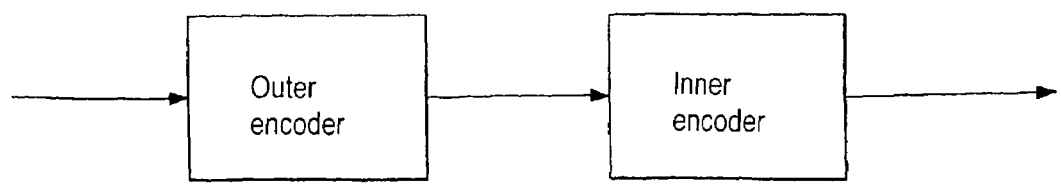
FIG. 2 shows a diagram of a known woven code.
Figure 3:
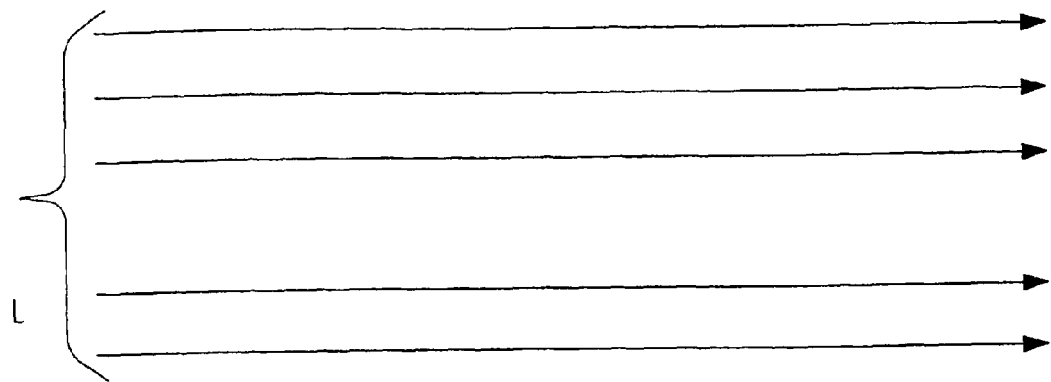
FIG. 3 shows a diagram of a concatenated code.
Figure 4:
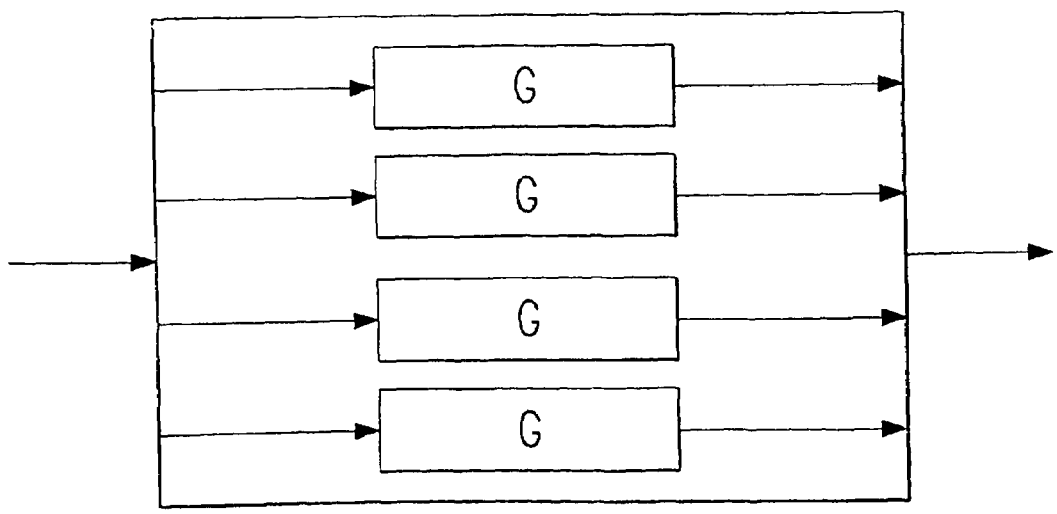
FIG. 4 shows a diagram of a parallel combination of codes.

FIG. 2 shows diagrammatically a known woven code comprising the concatenation of an outer and inner convolutional code without buffer. In the case of such a woven code, it is adequate for the correction of an error burst of length L if an interleaving of the L codes, which are capable of correcting an error, is used. If, in this case, each individual code is capable of correcting t-errors, the structure resulting therefrom will correct t error bursts. This is shown diagrammatically in FIG. 3 for concatenated codes. The encoder of such a structure comprises a parallel combination of codes, as is shown in FIG. 4.

Generally, such a concatenated code with its generator matrix can be shown by the following formula:

$$G^c = G \otimes I_L.$$

This corresponds to the Kronecker product of a generator matrix of the convolutional code G having an identity matrix I of size L.

Figure 5:
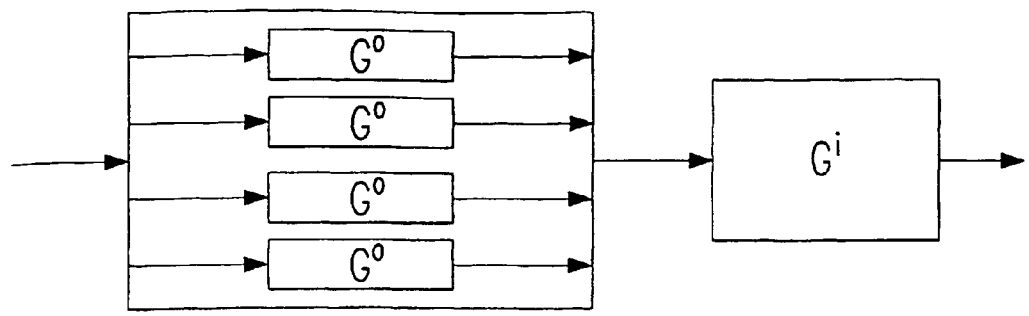
FIG. 5 shows a diagram of a woven code having an outer warp.

FIG. 5 shows the basic diagram of a so-called woven code having an outer warp, such as is produced by the concatenated combination of two convolutional codes according to FIG. 2 and, in particular, by replacing the outer code according to FIG. 2 by the code structure according to FIG. 4. The generator matrix of said code according to FIG. 5 obeys the formula $$G^{ow} = (G^o \otimes I_{Lo}) \cdot G^i,$$

where $G^{ow}$ is the generator matrix of the woven code with outer warp, $G^o$ and $G^i$ correspond to the generator matrices of the outer and inner codes, and $I_{LO}$ is a Lo-order identity matrix.

This shows that, during the decoding, the error bursts generated by the decoder of the inner code are uniformly distributed between the various outer codes. This results in independent errors in the outer code.

Figure 6:
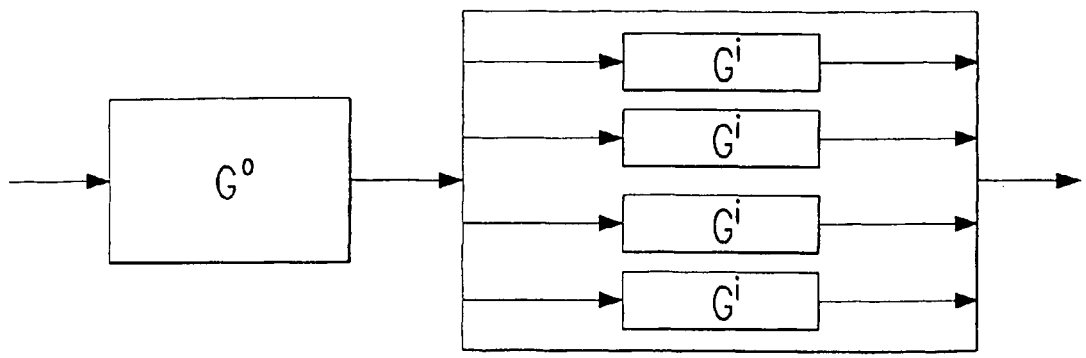
FIG. 6 is a diagram of a woven code with inner warp.

If the inner code is replaced by the structure according to FIG. 4 described in the concatenated combination of the two convolutional codes, the so-called woven code with inner warp in accordance with FIG. 6 is produced. The generator matrix $$G^{iw} = G^o \cdot (G^1 \otimes I_{Li}),$$

where $G^{iw}$ is the generator matrix of the woven code with outer warp. $G^o$ and $G^i$ correspond to the generator matrices of the outer and inner codes and $I_{Li}$ is the Li-order identity matrix.

Here, again, during the decoding, the error bursts generated by the decoder are independently distributed between the various inner codes. This again results in independent errors in the outer code.

Figure 7:
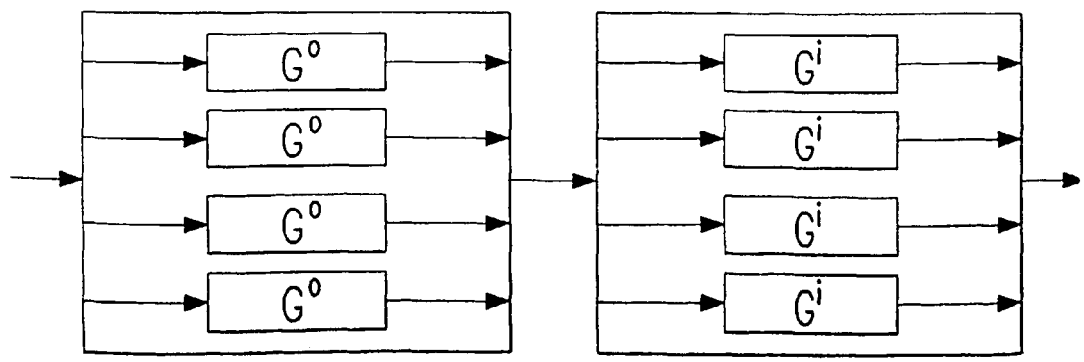
FIG. 7 is a diagram of a woven code with double warp.

If both the inner and the outer codes are replaced by the described structure according to FIG. 4 in the concatenated combination of the two convolutional codes, the so-called woven code with double warp (twill) according to FIG. 7 is produced. The generator matrix of said code obeys the formula $$G^{dw} = (G^o \otimes I_{Lo}) \cdot (G^i \otimes I_{Li}),$$

where $G^{dw}$ is the generator matrix of the woven code with double warp, $G^o$ and $G^i$ correspond to the generator matrix of the outer and inner codes, $I_{Lo}$ is the Lo-order identity matrix and $I_{Li}$ is the Li-order identity matrix.

Figure 8:
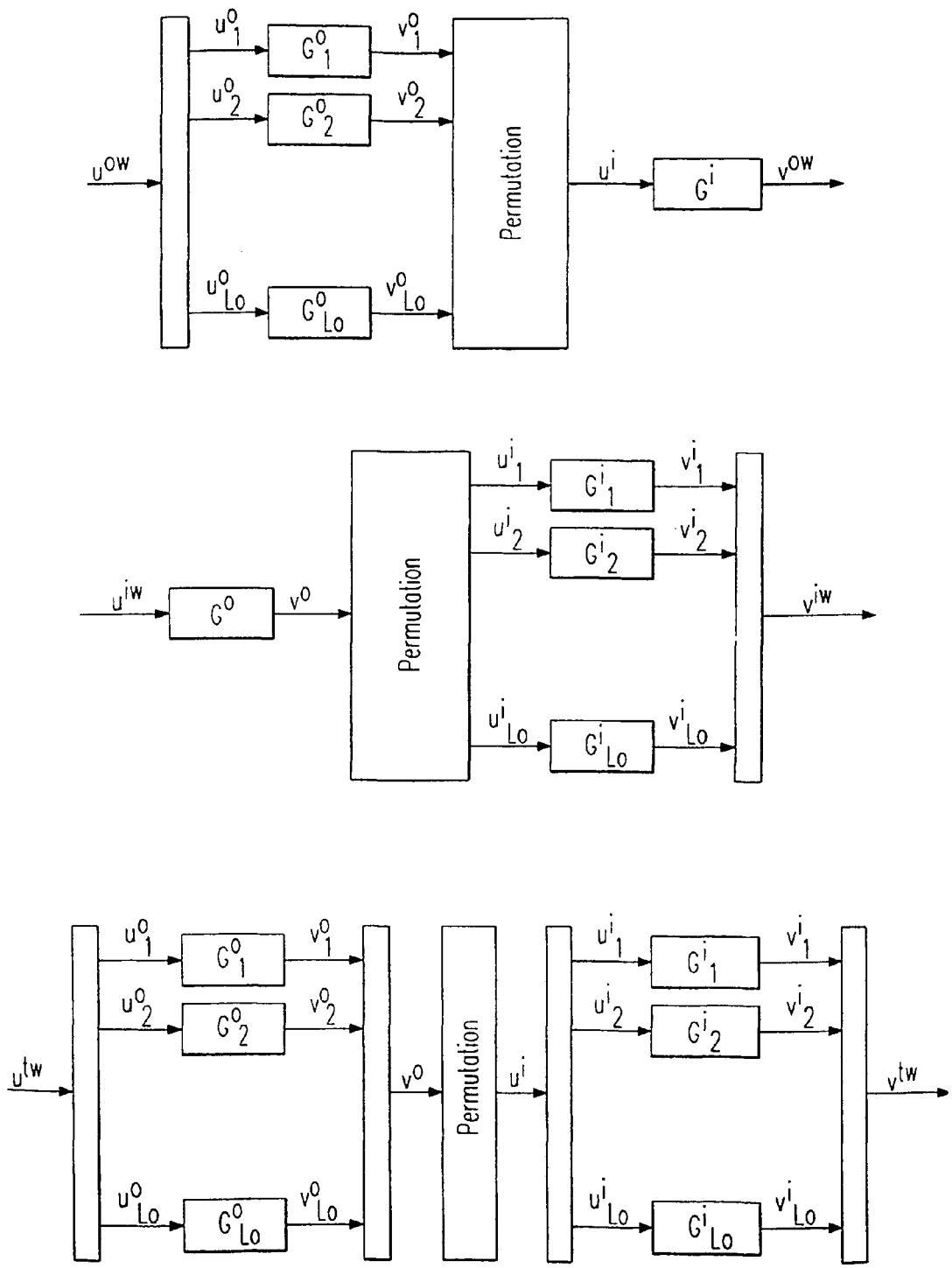
FIG. 8 is a diagram of an encoder for outer warp, inner warp, and double warp.

In each of the said codes of the woven codes, a permutation can be implemented between the encoders of the inner and outer codes. This makes it possible, particularly in AWGN channels, to improve the correction characteristics. The corresponding diagram of the encoders for outer warp, inner warp and double warp is shown in FIG. 8.

The partitioning of the redundancy of the inner and outer codes between the rows and columns or between the consecutive frequency segments and within the individual frequency segments is explained below for the various revealed types of a woven code. A woven code with the code rate R=⅛ serves as an example of this. In this example, it is assumed that systematic convolutional codes with recursive encoding are used as outer and inner codes in all cases.

Figure 9:
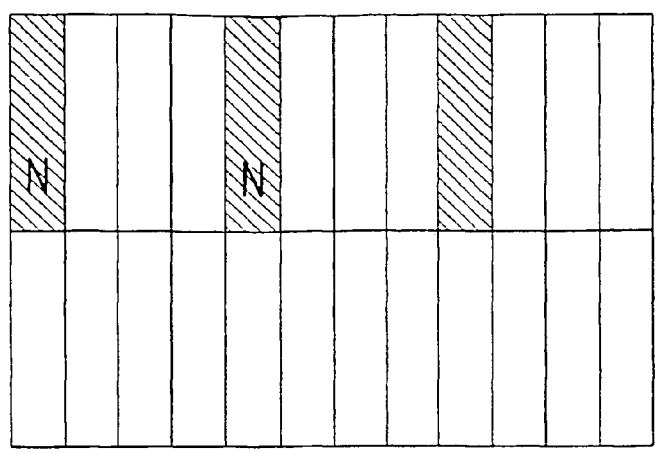
FIG. 9 is a diagram showing a woven code with outer warp.
Figure 9:
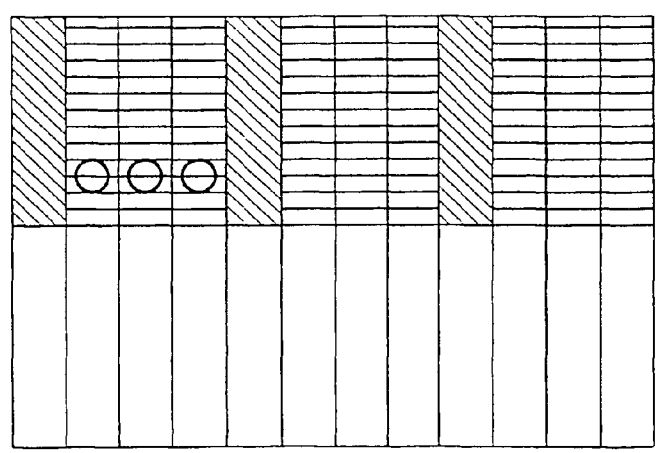
Figure 9:
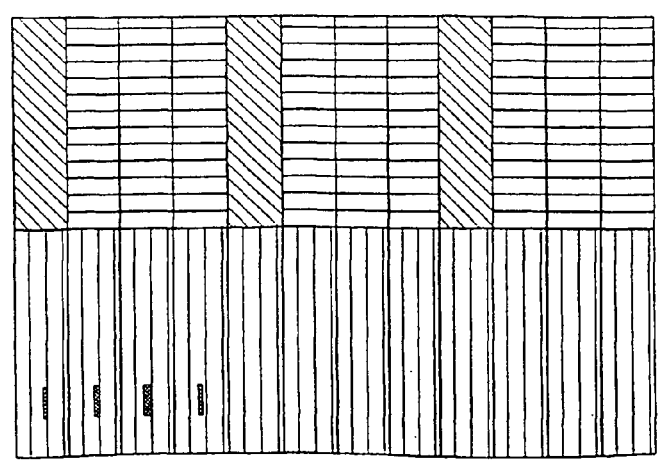

FIG. 9 again shows the woven code with outer warp. In the drawings, the user information items N are obliquely hatched, the test symbols of the outer code O are horizontally hatched and the test symbols of the inner code I are shown in each case as vertically hatched.

From the scheme mentioned at the outset of the woven code, the encoding is first performed with the test information items of the outer code in the frequency segments sent between the user information items N and, specifically, with a convolutional code having the rate $R^o=¼$. All the frequency segments (hops) are then encoded independently of one another with an optionally terminated convolutional code having the rate $R^i=½$.

Prior to encoding with the inner code, the symbols can be subjected in each hop to a permutation in various ways. The permutation cycle is T hops, i.e. the i-th hop and the i+T hop are subjected to one and the same permutation. The permutation is described, inter alia, in "Bronstein-Semendjajew Taschenbuch der Mathematik" (Bronstein-Semendjajew Handbook of Mathematics).

This type of encoding generates a woven code with an outer warp in modified form in which, as a departure from the classic case, the inner code is terminated in each hop.

Simultaneously, puncturing, known per se, of the outer code can be performed, as is described, for example, in J. Hagenauer, "Rate-Compatible Punctured Convolutional Codes (RCPC Codes) and Their Applications", IEEE Transactions on Communications, vol. 36, No. 4, April 1988, pages 389 et seq. The code rate can be correspondingly increased by such a puncturing, known per se, and specifically to R=(⅙ ¼).

Figure 10:
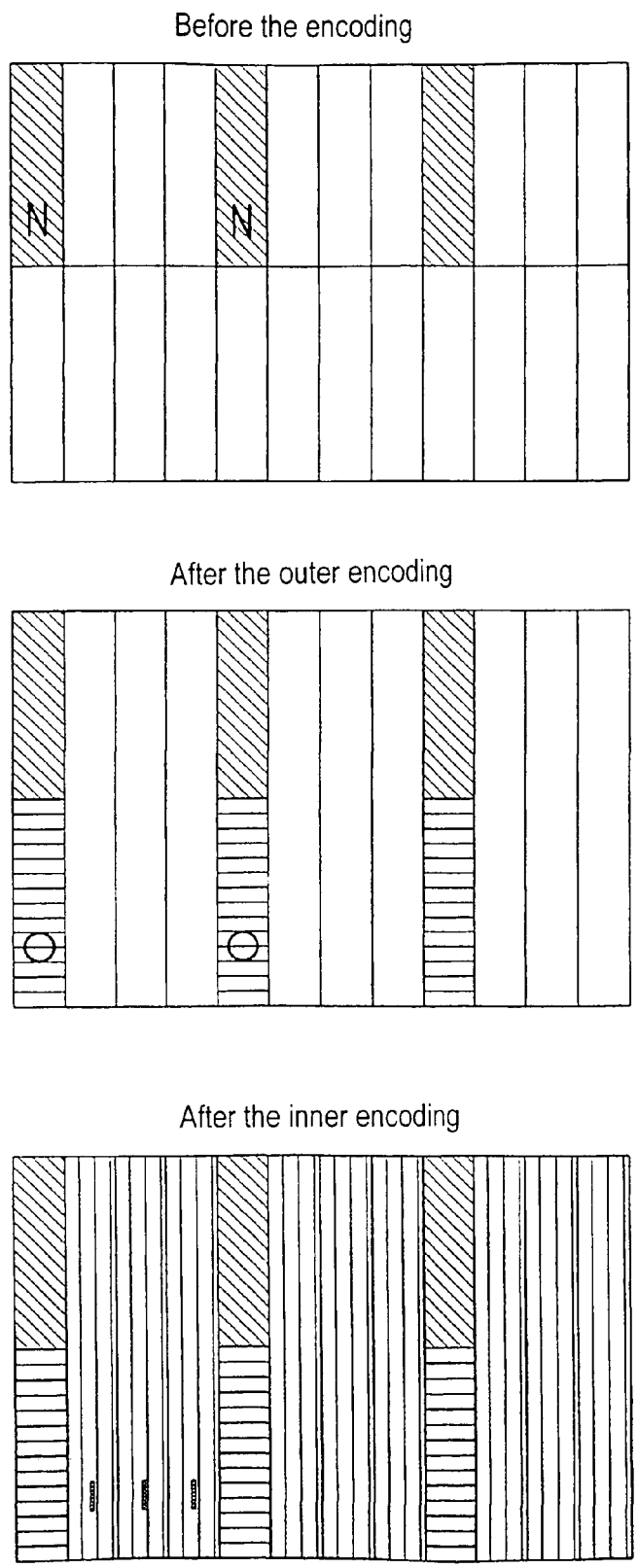
FIG. 10 shows a system of woven codes with inner warp.

FIG. 10 shows the system of woven codes with inner warp. Here, the consecutive frequency segments having a convolutional code with the rate $R^o=½$ are first encoded independently of one another. All the hops having an optionally terminated convolutional code with the rate $R^i=¼$ can then be encoded independently of one another.

Further to the encoding with the inner code, the symbols in each hop can again be subjected to a permutation in different ways, the permutation cycle again being T hops.

This also again produces a modified woven code with inner warp in which the outer code can be terminated in each frequency segment. Regardless of the termination of the outer code, the resultant code becomes a convolutional code with the rate $$R^{iw} = R^o \times R^i = 1/8.$$

As in the case of the outer warp, the code rate can be increased by puncturing.

The incorporation of the test symbols in the frequency segments together with the information symbols can be disadvantageous in some cases, for example if frequency segments are completely or partly suppressed by fading and erased.

Figure 11:
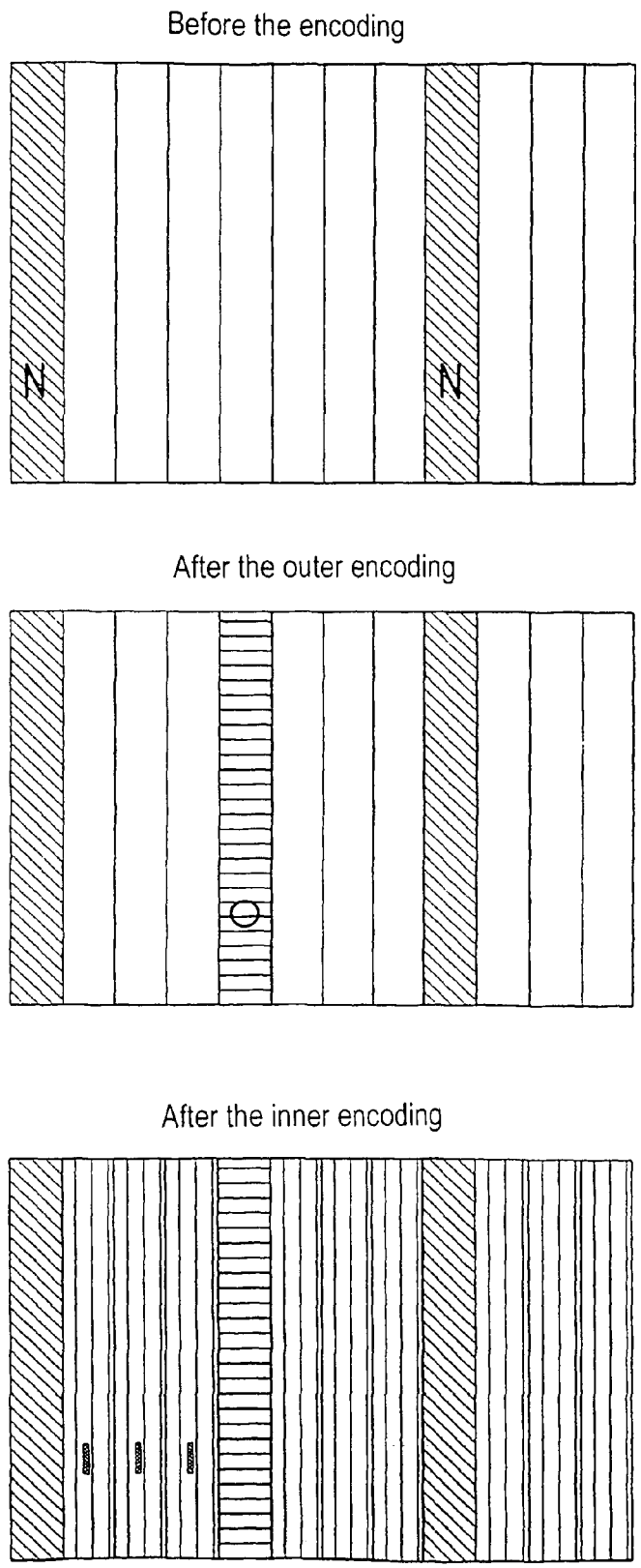
FIG. 11 shows a system of woven code with double warp.

This disadvantage is avoided by the woven code with double warp, shown in FIG. 11, in which the test information items of the outer code 0 and the test information items of the inner code I are each transmitted in separate hops between the user information items N.

In the case investigated, the information symbols are written cyclically with the cycle $1/R^{dw}$ into the hops, $R^{dw}$ being the rate of this structure.

As follows from the diagram of the encoder, the hops having a convolutional code with the rate $R^o = \frac{1}{2}$ are first encoded independently of one another.

The result of such an encoding (test symbols of the outer code) is written cyclically with the cycle $1/R^{dw}$ into the corresponding hops.

All the hops having a plurality of convolutional codes with the rate $R^i = \frac{1}{4}$ are then encoded independently of one another.

Prior to the encoding with the inner code, the symbols in each hop can be subjected to a permutation in various ways. The permutation cycle is T hops.

As a result of such an encoding, a woven code with double warp is obtained.

The code resulting therefrom becomes, regardless of a termination of the outer code, a convolutional code having the rate $$R^{dw} = R^o \cdot R^i = 1/8.$$

As in the case of the outer warp, the code rate can be increased by puncturing.

Figure 12:
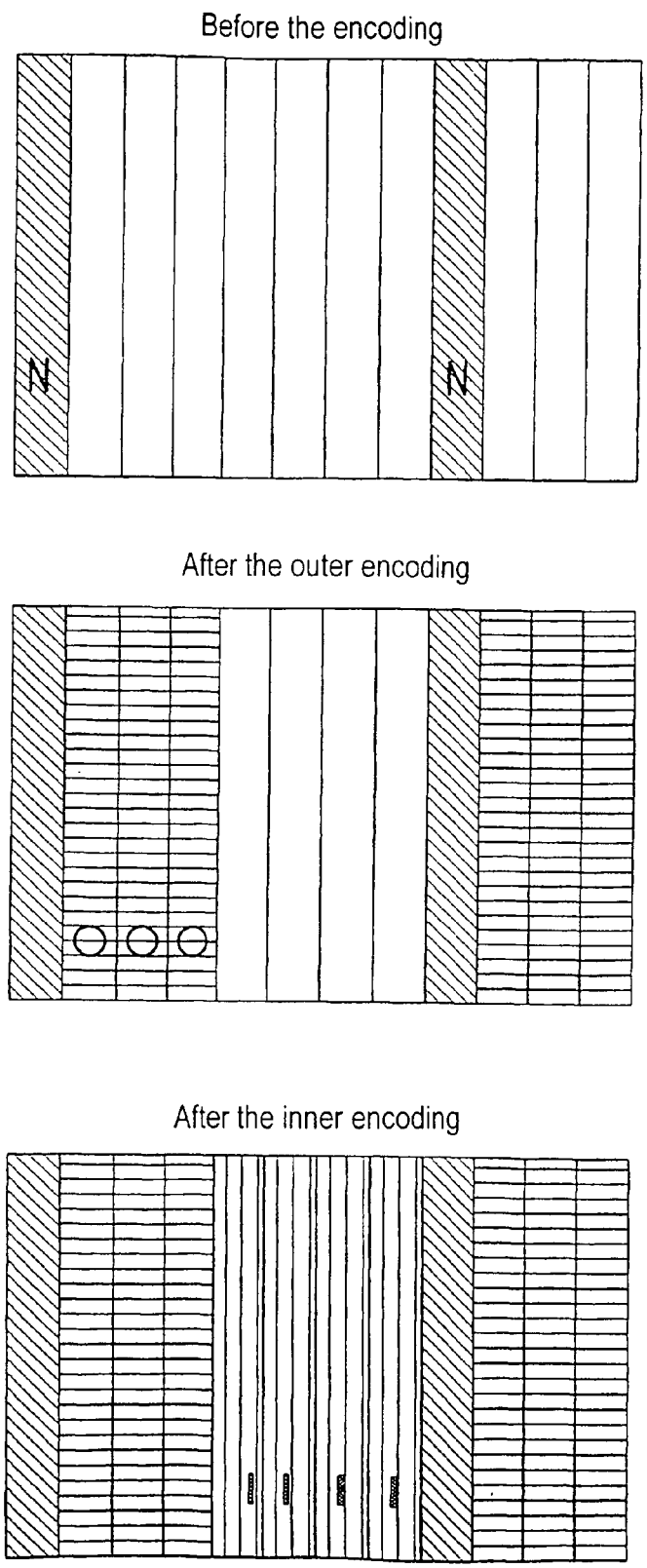
FIG. 12 shows the general distribution of information symbols and test symbols between the hops and in the hops.

The structure of the woven turbo code is achieved below. The general distribution of the information symbols and test symbols between the hops and in the hops is shown in FIG. 12.

The information symbols are written cyclically with the cycle $1/R^{wt}$ into the hops, $R^{wt}$ being the rate of said structure. As follows from the diagram of the encoder, the hops having a convolutional code with the rate $R^o = \frac{1}{4}$ are first encoded independently of one another in the example.

The result of the encoding (test symbols of the outer code) are written cyclically with the cycle $1/R^{wt}$ into the corresponding hops. All the hops (only the information symbols) are then encoded independently of one another with a plurality of convolutional codes with the rate $R^i = \frac{1}{5}$.

Prior to the encoding with the inner code, the symbols in each hop can be subjected to a permutation in various ways. The permutation cycle is T hops.

As a result of such an encoding, we obtain a woven turbo code. All the test symbols of both codes are distributed between the various columns. In addition, each of the individual codes has a lower rate. This is advantageous for transmission in poor channels.

The code resulting therefrom becomes a convolutional code with the rate $$R^{wt} = \frac{R^o \cdot R^i}{R^o + R^i - R^o \cdot R^i} = 1/8$$

Puncturing of both or optionally of the outer and inner code produces a code with the rates $$R = \{1/7 \quad 1/6 \quad 1/5 \quad 1/4 \quad 1/3\}$$

In addition to the cyclic and systematic partitioning of information items and test information items, it may also be advantageous, independently of the channel over which the transmission is to take place, to combine temporally hops containing information items and/or test information items.

An iterative turbo decoder is used for the decoding. Such decoders are known and described, for example, in Johannesson, R.; Zigangirov, K. "Fundamentals of Convolutional Coding", IEEE Press, 1999, ISBN 0-7803-3483-3. During the decoding, the structures of the code diagrams or parallelism of the codes (outer warp, inner warp, double warp and woven turbo) and also the use of the permuters in accordance with FIG. 8 are taken into account.

Advantageously, the outer and inner codes are decoded with the aid of the a posteriori probability algorithm (APP). This algorithm is likewise known and is described in Johannesson. Since the receiver knows the code structure used, it can use the knowledge about the termination of the codes to reduce the effort in the decoder.

If the APP is used in a sliding window version, the delay in the decoding can be minimized and adapted to the maximum permissible delay for the transmission.

Figure 13:
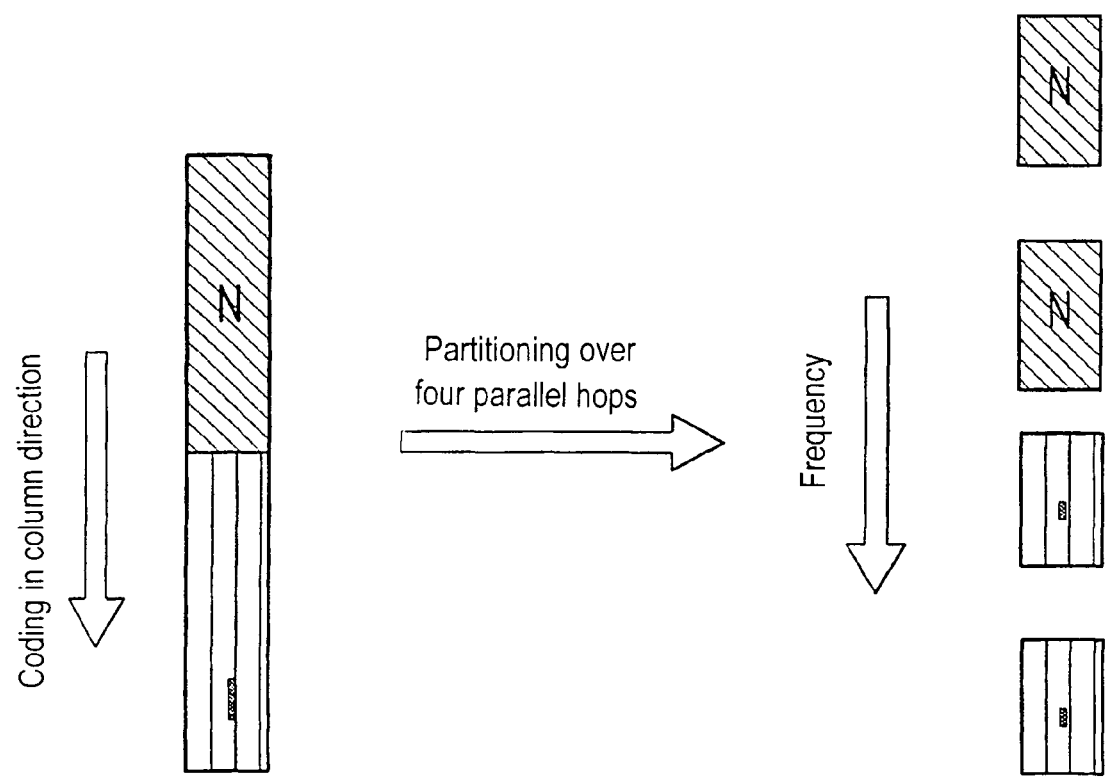
FIG. 13 shows the distribution of data of a frequency segment (hop) over a plurality of parallel frequency segments that are each emitted at different frequencies.

FIG. 13 shows the distribution of the data of a frequency segment (hop) over a plurality of parallel frequency segments that are each emitted at different frequencies.

FIG. 13 shows this for a woven code with outer warp. The user information items N are transmitted in parallel in two frequency segments (hops) and the test symbols of the inner code of the code rate ½, likewise in two frequency segments. For subsequent considerations, it is assumed that disturbances and fading drops are equally distributed over the range in which the transmission system operates, and are also statistically independent of one another. As a rule, these assumptions apply in the case of sufficiently large frequency ranges.

The number of parallel frequency segments can in principle be chosen freely. Owing to the frequency hopping method, however, separate carrier synchronization and symbol clock synchronization has, as a rule, to be performed for each of said parallel frequency segments. Said synchronization requires additional information items that reduce the actual transmission rate. With too many parallel frequency segments, said transmission rate accordingly drops considerably.

In the method with outer warp, only an inner code is again used. In the case of transmission in a plurality of parallel frequency segments, all the user information items and the test symbols of the outer codes, which are distributed over the parallel frequency segments, are protected by said inner code. If one of the frequency segments is now disturbed, the user information that is contained in the frequency segments emitted in parallel can be recovered if the inner code has the appropriate error correction facility. This additional correction facility of the inner code generates correspondingly fewer errors in the inner decoding, with the result that the outer codes have to correct fewer errors in total and the performance of the entire arrangement is increased. The structure with outer warp according to the inner coding again corresponds to FIG. 9. The user data N or test symbols of the outer code disposed in the column direction are distributed, together with the test symbols of the inner code, over the frequency segments emitted in parallel.

In the method with inner warp, the inner codes protect the user information items emitted in the parallel frequency segments and also the test symbols of the outer code. If one of the parallel frequency segments is now disturbed, only a part of the inner code is affected.

Accordingly, only the affected part of the inner code has also to correct the additional errors. This helps the outer code during the decoding. The structure with inner warp is shown in FIG. 10. The user data disposed in the column direction and the test symbols of the outer code or the test symbols of the inner codes are distributed over the frequency segments emitted in parallel.

In the method with double warp, the user information items and also test symbols are transmitted in different hops. Owing to the statistical equipartitioning described above of the fading drops and disturbance, only a part of the outer codes will have to correct disturbed symbols. The structure with double warp is shown in FIG. 11. The user data disposed in the column direction or test symbols of the outer and inner codes are distributed over the hops emitted in parallel.

In the woven turbo encoding, as in the case of the double warp, the user information items, the test symbols of the outer code and also of the inner codes are transmitted in parallel frequency segments. This structure corresponds to FIG. 12. The user data disposed in the column direction or test symbols of the outer code and of the inner codes are distributed over the frequency segments emitted in parallel.

For all the code structures, this principle offers advantages over the transmission in a frequency segment that is continuous in terms of frequency. Owing to the code structure of the inner and outer warp, it can, however, be used particularly advantageously here.

The individual parallel frequency segments (hops) can be chosen in the frequency range with constant frequency spacing, possibly also equidistantly. If a plurality of transmitters transmit with the same method in the same frequency range and the frequency hop pattern is not orthogonal, all the parallel frequency segments may, however, be disturbed in this case. It is therefore advantageous to use a special algorithm that undertakes the distribution of the parallel frequency segments in the frequency range in such a way that such disturbances are avoided. As a rule, this algorithm will generate temporally dependent arrangements.

The distribution of the user and test symbols over the parallel frequency segments can in principle be chosen as desired. The allocation may optionally also be permutated temporally. Thus, for example, in the case of an arrangement with outer warp, the distribution of the user information and of the test symbols of the inner code over the individual frequency segments emitted in parallel may vary temporally. Such a permutation may likewise take place according to a special algorithm. It is also conceivable to distribute the data to be transmitted not over the parallel frequency segments, but to transmit all the data completely and simultaneously in each of the parallel frequency segments.

Instead of the partitioning of the data to be transmitted per frequency segment over a plurality of frequency segments sent in parallel, a simplified system is also possible in which all the data of a frequency segment are transmitted in each case on a plurality of parallel frequency segments that are sent at different frequencies. In this case, known methods could then be used in the receiver in order to recombine the data thus transmitted in frequency diversity. Thus, for example, all the parallel frequency segments (hops) could be decoded completely and in parallel and a selection could then be made according to the majority principle. Another possibility is to combine the individual frequency segments according to the principle of the maximum ratio combining and then to decode in a single decoder.

The invention claimed is:

1. System for transmitting data by a frequency hopping method, in which the data are transmitted in abruptly changing transmission frequency segments (hops), wherein the data in consecutive frequency segments are encoded according to a woven code that comprises the concatenation of an outer and an inner convolutional code, characterized in that encoding is performed according to the woven code with outer warp, wherein user information items are transmitted in one of the frequency segments, test information items of the outer code are transmitted in another of the frequency segments and the test information items of the inner code, together with the user information items and the test information items of the outer code, are transmitted in all the frequency segments.

2. System according to claim 1, characterized in that the inner code is terminated.

3. System according to claim 2, characterized in that the outer code has a greater redundancy.

4. System according to claim 1, characterized in that the inner and/or outer code is terminated.

5. System according to claim 1, characterized in that only the outer code is punctured.

6. System according to claim 1, characterized in that permutators are used between outer and inner code.

7. System according to claim 6, characterized in that the permutations are cyclic.

8. System according to claim 6, characterized in that the user information items and test information items in the temporally consecutive frequency segments are transmitted cyclically.

9. System according to claim 8, characterized in that the cycle is determined by the total code rate and the number of information items transmitted per frequency segment.

10. System according to claim 1, characterized in that the chosen distribution of the user information items and test information items in the temporally consecutive frequency segments is chosen in such a way that the transmission channel no longer has any error propagation.

11. System according to claim 1, characterized in that the chosen distribution of user information items and test information items over the frequency segments is chosen in such a way that the delay due to the encoding is minimum.

12. System according to claim 1, characterized in that the codes are chosen in such a way that the desired maximum error rate is maintained after decoding.

13. System according to claim 1, characterized in that, if the transmission properties of the transmission channel are changed, the code schemes used are adapted accordingly.

14. System according to claim 13, characterized in that additional information items about the currently used code are transmitted from the transmitter to the receiver multiplexed with the data transmission.

15. System according to claim 14, characterized in that the additional information is transmitted whenever the transmitter changes the code schemes.

16. System according to claim 14 or 15, characterized in that the additional information is encoded according to a woven code and is transmitted distributed over a plurality of frequency segments.

17. System according to claim 14, characterized in that the chosen code rate for the additional information is less than the normal data transmission rate.

18. System according to claim 1, characterized in that the encoded transmission data are decoded in the receiver by means of an iterative turbo decoder.

19. System according to claim 18, characterized in that the inner and the outer codes are decoded according to the APP algorithm and, during decoding, the information about the termination of the codes is taken into account.

20. System according to claim 18, characterized in that, to reduce the delay in decoding, a sliding window version of the APP decoder is used.

21. System according to claim 1, characterized in that the data to be transmitted per frequency segment are transmitted distributed over a plurality of parallel frequency segments transmitted at different frequencies.

22. System according to claim 21 for a woven code with outer warp, characterized in that the encoding of the inner code is transmitted over all the frequency segments emitted in parallel.

23. System according to claim 21 for a woven code with inner warp, characterized in that the outer coding is transmitted over all the frequency segments emitted in parallel that contain user information items in each case.

24. System according to claim 1 for a woven code with double warp, characterized in that the user information items and also the test information items of the outer and inner codes are transmitted distributed over the frequency segments emitted in parallel.

25. System according to claim 1 for a woven turbo code, characterized in that the user information items and also the test information items of the outer and inner codes are transmitted distributed over the frequency segments emitted in parallel.

26. System according to claim 1, characterized in that the individual data are arbitrarily distributed over the frequency segments emitted in parallel.

27. System according to claim 26, characterized in that the distribution of the individual data over the frequency segments emitted in parallel is changed temporarily.

28. System according to claim 1, characterized in that the entire data of a frequency segment is transmitted in a plurality of frequency segments transmitted in parallel at different frequencies.

29. System according to claim 1, characterized in that the frequency spacing of the frequency segments emitted in parallel is constant.

30. System according to claim 1, characterized in that the frequency spacing of the frequency segments emitted in parallel is equidistant.

31. System according to claim 1, characterized in that the frequency spacing of the frequency segments emitted in parallel is changed as a function of time according to a predetermined algorithm.

32. System for transmitting data by a frequency hopping method, in which the data are transmitted in abruptly changing transmission frequency segments (hops), wherein the data in consecutive frequency segments are encoded according to a woven code that comprises the concatenation of an outer and an inner convolutional code, characterized in that encoding is performed according to the woven code with inner warp, wherein user information items and test information items of the outer code are transmitted together in one of the frequency segments and the test information items of the inner code are transmitted in each case in other frequency segments.

33. System according to claim 32, characterized in that the outer code is terminated.

34. System according to claim 32, characterized in that the inner code has a greater redundancy.

35. System according to claim 32, characterized in that the inner and/or outer code is terminated.

36. System according to claim 32, characterized in that only the outer code is punctured.

37. System according to claim 32, characterized in that permutators are used between outer and inner code.

38. System according to claim 37, characterized in that the permutations are cyclic.

39. System according to claim 32, characterized in that the user information items and test information items in the temporally consecutive frequency segments are transmitted cyclically.

40. System according to claim 39, characterized in that the cycle is determined by the total code rate and the number of information items transmitted per frequency segment.

41. System according to claim 32, characterized in that the chosen distribution of the user information items and test information items in the temporally consecutive frequency segments is chosen in such a way that the transmission channel no longer has any error propagation.

42. System according to claim 32, characterized in that the chosen distribution of user information items and test information items over the frequency segments is chosen in such a way that the delay due to the encoding is minimum.

43. System according to claim 32, characterized in that the codes are chosen in such a way that the desired maximum error rate is maintained after decoding.

44. System according to claim 32, characterized in that, if the transmission properties of the transmission channel are changed, the code schemes are adapted accordingly.

45. System according to claim 44, characterized in that additional information items about the currently used code are transmitted from the transmitter to the receiver multiplexed with the data transmission.

46. System according to claim 45, characterized in that the additional information is transmitted whenever the transmitter changes the code schemes.

47. System according to claim 45, characterized in that the additional information is encoded according to a woven code and is transmitted distributed over a plurality of frequency segments.

48. System according to claim 45, characterized in that the chosen code rate for the additional information is less than the normal data transmission rate.

49. System according to claim 32, characterized in that the encoded transmission data are decoded in the receiver by means of an iterative turbo decoder.

50. System according to claim 49, characterized in that the inner and the outer codes are decoded according to the APP algorithm and, during decoding, the information about the termination of the codes is taken into account.

51. System according to claim 49, characterized in that, to reduce the delay in decoding, a sliding window version of the APP decoder is used.

52. System according to claim 32, characterized in that the data to be transmitted per frequency segment are transmitted distributed over a plurality of parallel frequency segments transmitted at different frequencies.

53. System according to claim 52 for a woven code with outer warp, characterized in that the encoding of the inner code is transmitted over all the frequency segments emitted in parallel.

54. System according to claim 52 for a woven code with inner warp, characterized in that the outer coding is transmitted over all the frequency segments emitted in parallel that contain user information items in each case.

55. System according to claim 32 for a woven code with double warp, characterized in that the user information items and also the test information items of the outer and inner codes are transmitted distributed over the frequency segments emitted in parallel.

56. System according to claim 32, characterized in that the individual data are arbitrarily distributed over the frequency segments emitted in parallel.

57. System according to claim 56, characterized in that the distribution of the individual data over the frequency segments emitted in parallel is changed temporally.

58. System according to claim 32, characterized in that the entire data of a frequency segment is transmitted in a plurality of frequency segments transmitted in parallel at different frequencies.

59. System according to claim 32, characterized in that the frequency spacing of the frequency segments emitted in parallel is constant.

60. System according to claim 32, characterized in that the frequency spacing of the frequency segments emitted in parallel is equidistant.

61. System according to claim 32, characterized in that the frequency spacing of the frequency segments emitted in parallel is changed as a function of time according to a predetermined algorithm.

62. System for transmitting data by a frequency hopping method, in which the data are transmitted in abruptly changing transmission frequency segments (hops), wherein the data in consecutive frequency segments are encoded according to a woven code that comprises the concatenation of an outer and an inner convolutional code, characterized in that encoding is performed according to the woven code with double warp and user information items, test information items of the outer code and the test information items of the inner code are each transmitted in different frequency segments.

63. System according to claim 62, characterized in that the outer code is terminated.

64. System according to claim 62, characterized in that the inner code has a greater redundancy.

65. System according to claim 62, characterized in that the inner and/or outer code is terminated.

66. System according to claim 62, characterized in that only the outer code is punctured.

67. System according to claim 62, characterized in that the permutators are used between outer and inner code.

68. System according to claim 67, characterized in that the permutations are cyclic.

69. System according to claim 62, characterized in that the user information items and test information items in the temporally consecutive frequency segments are transmitted cyclically.

70. System according to claim 69, characterized in that the cycle is determined by the total code rate and the number of information items transmitted per frequency segment.

71. System according to claim 62, characterized in that the chosen distribution of the user information items and test information items in the temporally consecutive frequency segments is chosen in such a way that the transmission channel no longer has any error propagation.

72. System according to claim 62, characterized in that the chosen distribution of user information items and test information items over the frequency segments is chosen in such a way that the delay due to the encoding is minimum.

73. System according to claim 62, characterized in that the codes are chosen in such a way that the desired maximum error rate is maintained after decoding.

74. System according to claim 62, characterized in that, if the transmission properties of the transmission channel are changed, the code schemes used are adapted accordingly.

75. System according to claim 74, characterized in that additional information items about the currently used code are transmitted from the transmitter to the receiver multiplexed with the data transmission.

76. System according to claim 74, characterized in that the additional information is transmitted whenever the transmitter changes the code schemes.

77. System according to claim 74, characterized in that the additional information is encoded according to a woven code and is transmitted distributed over a plurality of frequency segments.

78. System according to claim 74, characterized in that the chosen code rate for the additional information is less than the normal data transmission rate.

79. System according to claim 62, characterized in that the encoded transmission data are decoded in the receiver by means of an iterative turbo decoder.

80. System according to claim 79, characterized in that the inner and the outer codes are decoded according to the APP algorithm and, during decoding, the information about the termination of the codes is taken into account.

81. System according to claim 79, characterized in that, to reduce the delay in decoding, a sliding window version of the APP decoder is used.

82. System according to claim 62, characterized in that the data to be transmitted per frequency segment are transmitted distributed over a plurality of parallel frequency segments transmitted at different frequencies.

83. System according to claim 82 for a woven code with outer warp, characterized in that the encoding of the inner code is transmitted over all the frequency segments emitted in parallel.

84. System according to claim 82 for a woven code with inner warp, characterized in that the outer coding is transmitted over all the frequency segments emitted in parallel that contain user information items in each case.

85. System according to claim 62, characterized in that the individual data are arbitrarily distributed over the frequency segments emitted in parallel.

86. System according to claim 85, characterized in that the distribution of the individual data over the frequency segments emitted in parallel is changed temporally.

87. System according to claim 62, characterized in that the entire data of a frequency segment is transmitted in a plurality of frequency segments transmitted in parallel at different frequencies.

88. System according to claim 62, characterized in that the frequency spacing of the frequency segments emitted in parallel is constant.

89. System according to claim 62, characterized in that the frequency spacing of the frequency segments emitted in parallel is equidistant.

90. System according to claim 62, characterized in that the frequency spacing of the frequency segments emitted in parallel is changed as a function of time according to a predetermined algorithm.

91. System for transmitting data by a frequency hopping method, in which the data are transmitted in abruptly changing transmission frequency segments (hops), wherein the data in consecutive frequency segments are encoded according to a woven code that comprises the concatenation of an outer and an inner convolutional code, characterized in that encoding is performed according to a woven turbo code, wherein about the same code rate is used in each case for the inner and outer convolutional code and user information items and also test information items of the outer and inner codes are each transmitted in separate frequency segments.

92. System according to claim 91, characterized in that both the outer and the inner code are punctured.

93. System according to claim 91, characterized in that the inner and/or outer code is terminated.

94. System according to claim 91, characterized in that only the outer code is punctured.

95. System according to claim 91, characterized in that the permutators are used between outer and inner code.

96. System according to claim 95, characterized in that the permutations are cyclic.

97. System according to claim 91, characterized in that the user information items and test information items in the temporally consecutive frequency segments are transmitted cyclically.

98. System according to claim 97, characterized in that the cycle is determined by the total code rate and the number of information items transmitted per frequency segment.

99. System according to claim 91, characterized in that the chosen distribution of the user information items and test information items in the temporally consecutive frequency segments is chosen in such a way that the transmission channel no longer has any error propagation.

100. System according to claim 91, characterized in that the chosen distribution of user information items and test information items over the frequency segments is chosen in such a way that the delay due to the encoding is minimum.

101. System according to claim 91, characterized in that the codes are chosen in such a way that the desired maximum error rate is maintained after decoding.

102. System according to claim 91, characterized in that, if the transmission properties of the transmission channel are changed, the code schemes used are adapted accordingly.

103. System according to claim 101, characterized in that additional information items about the currently used code are transmitted from the transmitter to the receiver multiplexed with the data transmission.

104. System according to claim 101, characterized in that the additional information is transmitted whenever the transmitter changes the code schemes.

105. System according to claim 101, characterized in that the additional information is encoded according to a woven code and is transmitted distributed over a plurality of frequency segments.

106. System according to claim 101, characterized in that the chosen code rate for the additional information is less than the normal data transmission rate.

107. System according to claim 91, characterized in that the encoded transmission data are decoded in the receiver by means of an iterative turbo decoder.

108. System according to claim 107, characterized in that the inner and the outer codes are decoded according to the APP algorithm and, during decoding, the information about the termination of the codes is taken into account.

109. System according to claim 107, characterized in that, to reduce the delay in decoding, a sliding window version of the APP decoder is used.

110. System according to any of claim 91, characterized in that the data to be transmitted per frequency segment are transmitted distributed over a plurality of parallel frequency segments transmitted at different frequencies.

111. System according to claim 110 for a woven code with outer warp, characterized in that the encoding of the inner code is transmitted over all the frequency segments emitted in parallel.

112. System according to claim 110 for a woven code with inner warp, characterized in that the outer coding is transmitted over all the frequency segments emitted in parallel that contain user information items in each case.

113. System according to claim 91 for a woven turbo code, characterized in that the user information items and also the test information items of the outer and inner codes are transmitted distributed over the frequency segments emitted in parallel.

114. System according to claim 91, characterized in that the individual data are arbitrarily distributed over the frequency segments emitted in parallel.

115. System according to claim 114, characterized in that the distribution of the individual data over the frequency segments emitted in parallel is changed temporally.

116. System according to claim 91, characterized in that the entire data of a frequency segment is transmitted in a plurality of frequency segments transmitted in parallel at different frequencies.

117. System according to claim 91, characterized in that the frequency spacing of the frequency segments emitted in parallel is constant.

118. System according to claim 91, characterized in that the frequency spacing of the frequency segments emitted in parallel is equidistant.

119. System according to claim 91, characterized in that the frequency spacing of the frequency segments emitted in parallel is changed as a function of time according to a predetermined algorithm.

* * * * *